United States Patent
Siemieniec et al.

(10) Patent No.: US 9,818,827 B2
(45) Date of Patent: Nov. 14, 2017

(54) FIELD PLATE TRENCH SEMICONDUCTOR DEVICE WITH PLANAR GATE

(71) Applicant: Infineon Technologies Austria AG, Villach (AT)

(72) Inventors: Ralf Siemieniec, Villach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 90 days.

(21) Appl. No.: 14/681,145

(22) Filed: Apr. 8, 2015

(65) Prior Publication Data

US 2016/0300913 A1 Oct. 13, 2016

(51) Int. Cl.
| | |
|---|---|
| *H01L 29/40* | (2006.01) |
| *H01L 29/78* | (2006.01) |
| *H01L 29/06* | (2006.01) |
| *H01L 29/10* | (2006.01) |
| *H01L 29/423* | (2006.01) |
| *H01L 29/739* | (2006.01) |

(52) U.S. Cl.
CPC ........ *H01L 29/407* (2013.01); *H01L 29/0696* (2013.01); *H01L 29/1095* (2013.01); *H01L 29/404* (2013.01); *H01L 29/4238* (2013.01); *H01L 29/7396* (2013.01); *H01L 29/7802* (2013.01)

(58) Field of Classification Search
CPC ............... H01L 29/407; H01L 29/7813; H01L 29/1095; H01L 29/404; H01L 29/41766
See application file for complete search history.

(56) References Cited

U.S. PATENT DOCUMENTS

| 7,768,064 B2 | 8/2010 | Sapp et al. |
| 8,193,570 B2 | 6/2012 | Sapp et al. |

(Continued)

FOREIGN PATENT DOCUMENTS

DE 10007415 C2 1/2002

OTHER PUBLICATIONS

"CSD19536KCS 100 V N-Channel NexFETTM Power MOSFET", Texas Instruments; Jan. 2014—revised Oct. 2014 (available at http://www.ti.com/lit/ds/symlink/csd19536kcs.pdf).

*Primary Examiner* — Allen Parker
*Assistant Examiner* — Ismail Muse
(74) *Attorney, Agent, or Firm* — Murphy, Bilak & Homiller, PLLC

(57) ABSTRACT

A semiconductor device includes first and second load contacts and a semiconductor region extending along an extension direction. A surface region is arranged above and coupled to the semiconductor region. At least one control electrode is arranged within the surface region. At least one connector trench extends into the semiconductor region along the extension direction and includes a connector electrode. A contact pad is arranged within the surface region. A contact runner is arranged within the surface region and placed separately from both the contact pad and the at least one control electrode, the contact pad, the contact runner and the at least one control electrode being electrically coupled to each other. Either both the contact pad and the contact runner or both the contact runner and the at least one control electrode are electrically connected to the connector electrode of the at least one connector trench.

20 Claims, 9 Drawing Sheets

(56) References Cited

U.S. PATENT DOCUMENTS

| | | | |
|---|---|---|---|
| 2010/0052044 A1* | 3/2010 | Hirler | H01L 29/7813 257/328 |
| 2010/0117145 A1* | 5/2010 | Hshieh | H01L 29/404 257/330 |
| 2012/0056241 A1* | 3/2012 | Sumitomo | H01L 29/0619 257/139 |
| 2012/0170339 A1* | 7/2012 | Deboy | H01L 27/0817 363/127 |
| 2013/0240987 A1* | 9/2013 | Hirler | H01L 29/7813 257/331 |

* cited by examiner

FIELD PLATE TRENCH SEMICONDUCTOR DEVICE WITH PLANAR GATE

TECHNICAL FIELD

This specification refers to embodiments of semiconductor devices. In particular, this specification refers to embodiments of a field plate trench semiconductor device having a planar gate. For example, such semiconductor device may exhibit one of a MOSFET structure and an IGBT structure.

BACKGROUND

Many functions of modern devices in automotive, consumer and industrial applications, such as converting electrical energy and driving an electric motor or an electric machine, rely on semiconductor devices. For example Insulated Gate Bipolar Transistors (IGBTs), Metal Oxide Semiconductor Field Effect Transistors (MOSFETs) and diodes have been used for various applications including, but not limited to switches in power supplies and power converters.

Such power supplies or, respectively, power converters shall usually exhibit a high degree of efficiency. To this end, semiconductor devices have been proposed that exhibit a so-called compensation structure, wherein, e.g., the compensation structure can be established by means of so-called vertical field plate installed within a trench. Such compensation structure may lead to a reduction of the on-state resistance of the semiconductor device. For further reducing the amount gate charge and/or the amount of Miller charge, it has been proposed to employ a planar gate structure aligned substantially perpendicular to the vertical field plate.

SUMMARY

According to an embodiment, a semiconductor device is presented. The semiconductor device comprises a first load contact, a second load contact and a semiconductor region configured to conduct a load current between the first load contact and the second load contact in at least a forward direction. The semiconductor region includes: a first semiconductor contact zone comprising a semiconductor body region and a semiconductor source region, the semiconductor source region being electrically connected to the first load contact and being in contact with the semiconductor body region; a second semiconductor contact zone electrically connected to the second load contact; a semiconductor drift zone coupling the first semiconductor contact zone to the second semiconductor contact zone, wherein the semiconductor body region isolates the semiconductor source region from the semiconductor drift zone. The semiconductor device further comprises, in a vertical cross-section, at least two trenches extending into the semiconductor region along an extension direction that points from the first semiconductor contact zone to the second semiconductor zone, each trench comprising a trench electrode and an insulator insulating the respective trench electrode from the semiconductor region, wherein the semiconductor region comprises a mesa zone arranged between the at least two trenches, the mesa zone including the first semiconductor contact zone. The semiconductor device is configured to establish a load current path for conduction of the load current in the forward direction, wherein the load current path comprises, in a vertical cross-section of the mesa zone, only a single inversion channel, the single inversion channel being included in the semiconductor body region.

According to a further embodiment, a further semiconductor device is presented. The further semiconductor device comprises: a first load contact, a second load contact and a semiconductor region extending along an extension direction; a surface region arranged above the semiconductor region and coupled to the semiconductor region; at least one control electrode arranged within the surface region; at least one connector trench extending into the semiconductor region along the extension direction, the at least one connector trench including a connector electrode; a contact pad arranged within the surface region; a contact runner arranged within the surface region and placed separately from both the contact pad and the at least one control electrode, the contact pad, the contact runner and the at least one control electrode being electrically coupled to each other, wherein either both the contact pad and the contact runner or both the contact runner and the at least one control electrode are electrically connected to the connector electrode of the at least one connector trench.

According to yet a further embodiment, a yet further semiconductor device is presented. The semiconductor device comprises a semiconductor region extending along an extension direction and configured to conduct a load current; a surface region arranged above the semiconductor region and coupled to the semiconductor region; at least one electrode configured to control the load current, the at least one electrode being arranged within the surface region; a connector layer, the connector layer being arranged within the surface region; a contact pad arranged within the surface region and above the connector layer; a contact runner arranged within the surface region and above the connector layer, the contact runner being placed separately from the contact pad and being electrically coupled to the at least one electrode; at least one first contact plug, the at least one first contact plug extending along the extension direction and electrically connecting the contact pad to the connector layer; at least one second contact plug, the at least one second contact plug extending along the extension direction and electrically connecting the contact runner to the connector layer.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1A:
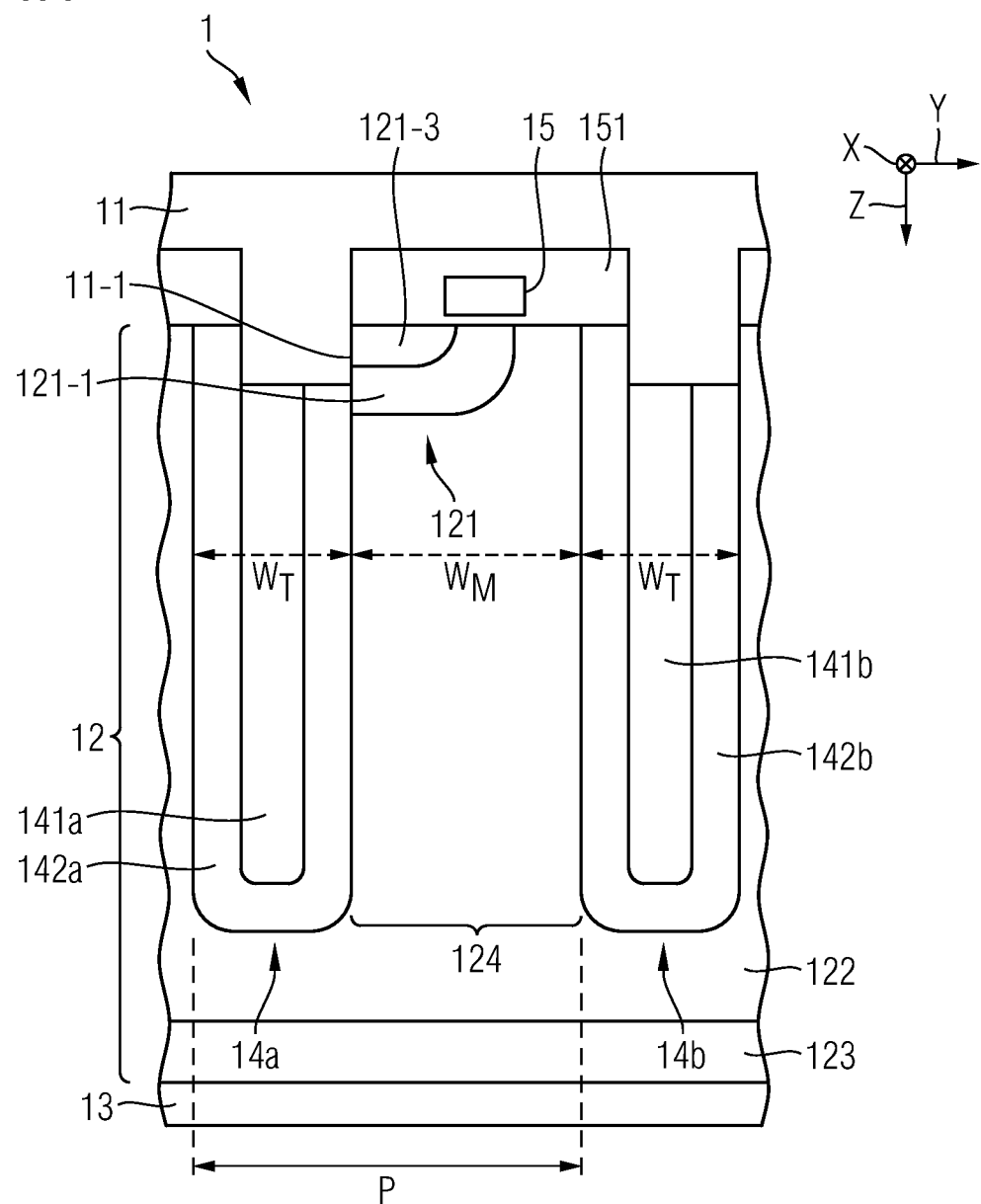
FIG. 1A schematically illustrates a section of a vertical cross-section of a semiconductor device according to one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die. For example, both the first lateral direction Y and the second lateral X mentioned below can be horizontal directions, wherein the first lateral direction Y and the second lateral X may be perpendicular to each other.

The term "vertical" as used in this specification intends to describe an orientation which is substantially arranged perpendicular to the horizontal surface, i.e., parallel to the normal direction of the surface of the semiconductor substrate or semiconductor region. For example, the extension direction Z mentioned below may be a vertical direction that is perpendicular to both the first lateral direction Y and the second lateral X.

In this specification, n-doped is referred to as "first conductivity type" while p-doped is referred to as "second conductivity type". Alternatively, opposite doping relations can be employed so that the first conductivity type can be p-doped and the second conductivity type can be n-doped. Further, within this specification, the term "doping concentration" may refer to an integral doping concentration or, respectively, to a mean doping concentration or to a sheet charge carrier concentration of a specific semiconductor region or semiconductor zone. Thus, e.g., a statement saying that a specific semiconductor region exhibits a certain doping concentration that is higher or lower as compared to a doping concentration of another semiconductor region may indicate that the respective mean doping concentrations of said semiconductor regions differ from each other.

In the context of the present specification, the terms "in Ohmic contact", "in electric contact", "in Ohmic connection", and "electrically connected" intend to describe that there is a low Ohmic electric connection or low Ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device, e.g., to a monolithically integrated IGBT, to a monolithically integrated MOS Gated Diode (MGD) or to a monolithically integrated MOSFET that may be used within a power converter or a power supply.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 5 V, more typically 15 V and above.

As used within the present specification, the term "forward current" may be a current that flows in one direction through the semiconductor device, e.g., from a backside of the semiconductor device to a frontside of the semiconductor device. Such forward current may be carried, e.g., by means of a transistor cell of the semiconductor device. Further, as used within the present specification, the term "reverse current" may be a current that flows in another direction through the semiconductor device, e.g., from a frontside of the semiconductor device to a backside of the semiconductor device. For instance, such reverse current may be carried by a diode cell of the semiconductor device. In certain embodiments, the semiconductor device may be configured for carrying both a forward current and a reverse current. In other words, the semiconductor device may be operated in both a forward current mode and a reverse current mode.

FIG. 1A schematically illustrates a section of a vertical cross-section of a semiconductor device 1 according to one or more embodiments. The semiconductor device 1 comprises a first load contact 11, a second load contact 13 and a semiconductor region 12 which can, e.g., be positioned in between the first load contact 11 and the second load contact 13. The semiconductor device 1 may exhibit a vertical structure, meaning that the first load contact 11, the second load contact 13 and the semiconductor region 12 can be arranged on top of each other along an extension direction Z, as illustrated in FIG. 1A.

The semiconductor region 12 can be arranged for conducting a load current between the first load contact 11 and the second load contact 13 in at least a forward direction, e.g., from the first load contact 11 to the second load contact 13 or, respectively, vice versa.

For example, the first load contact 11 may comprise a metallization layer arranged on a front side or, respectively, on a back side of the semiconductor device 1. Correspondingly, the second load contact 13 may also comprise a metallization layer arranged on the opposite side, i.e., on the backside or, respectively, on the front side of the semiconductor device 1. Both, the first load contact 11 and the second load contact 13 may be electrically connected to respective load terminals (not depicted in FIG. 1A) of the semiconductor device 1 so as to allow for receiving and outputting said load current.

The semiconductor region 12 may comprise a first semiconductor contact zone 121 that may include a semiconductor source region 121-3 electrically connected to the first load contact 11. For example, the semiconductor source region 121-3 is in contact with the first load contact 11 and may exhibit dopants of a first conductivity type. In an embodiment, the semiconductor source region 121-3 is a highly doped region, such as an $n^+$-region.

In addition, the first semiconductor contact zone 121 may comprise a semiconductor body region 121-1 that is in contact with semiconductor source region 121-3. For example, the semiconductor body region 121-1 may exhibit dopants of a second conductivity type complementary to the first conductivity type. In an embodiment, the semiconductor body region 121-1 is a doped region, such as a p-region. Thus, a transition between the semiconductor body region 121-1 and the semiconductor source region 121-3 may form a pn-junction.

The semiconductor region 12 can further comprise a second semiconductor contact zone 123 that is electrically connected to the second load contact 13. For example, the second semiconductor contact zone 123 may also exhibit dopants of the first conductivity type and/or dopants of a second conductivity type complementary to the first conductivity type. In an embodiment, the second semiconductor contact zone 123 is a heavily doped region, such as an $n^{++}$-region. Further examples of possible doping characteristics of the second semiconductor contact zone 123 will be described below.

A semiconductor drift zone 122 of the semiconductor region 12 may couple the first semiconductor contact zone 121 to the second semiconductor contact zone 123. For example, the semiconductor drift zone 122 is a comparatively weakly doped zone, such as an $n^-$-zone. Further, the semiconductor body region 121-1 may isolate said semiconductor source region 121-3 from the semiconductor drift zone 122.

The semiconductor drift zone 122 may extend along said extension direction Z that may point from the first semiconductor contact zone 121 to the second semiconductor contact zone 123. For example, the total extension of the semiconductor drift zone 122 along said extension direction Z is at least a multiple of the total extension along said extension direction Z of the first semiconductor contact zone 121. Further, the total extension along said extension direction Z of the second semiconductor contact zone 123 may be at least a multiple of the total extension of the semiconductor drift zone 122 along said extension direction Z.

As illustrated in FIG. 1A, the semiconductor device further comprises, in the illustrated vertical cross-section, at least two trenches 14a and 14b that extend into the semiconductor region 12 along said extension direction Z. Each trench 14a and 14b may comprise a trench electrode 141a, 141b and an insulator 142a, 142b. Said insulators 142a and 142b may insulate the respective trench electrode 141a, 141b from the semiconductor region 12. Further, said trench electrodes 141a and 141b may be electrically insulated from the second load contact 13 and may be electrically connected to the first load contact 11. For example, said trench electrodes 141a and 141b may allow for a charge compensation within the semiconductor drift zone 122.

In accordance with an embodiment, a path electrically connecting the trench electrodes 141a and 141b to the first load contact 11 may comprise a resistance region exhibiting a locally increased Ohmic resistance. Such locally increased Ohmic resistance can be achieved, e.g., by means of a reduced cross-section area of said path.

In between said two trenches 14a and 14b, there can be arranged a mesa zone 124, wherein said mesa zone 124 may form a part of the semiconductor region 12. In other words, the section of the semiconductor region 12 that is laterally confined by said two trenches 14a and 14b can be defined as said mesa zone 124. The mesa zone 124 may include said first semiconductor contact zone 121. That is to say, the first semiconductor contact zone 121 may also be arranged in between said two trenches 14a and 14b, e.g., in an upper region of said mesa zone 124.

The semiconductor device 1 can be configured to establish a load current path within the semiconductor region 12 for conduction of said load current in the forward direction. Said established load current path may comprise, in the illustrated vertical cross-section of the mesa zone 124, only a single inversion channel. Said single inversion channel is included in the semiconductor body region 121-1.

For example, the established load current path for conduction of the load current in the forward direction further comprises, within said vertical cross-section of the mesa zone 124, only one first-load-contact-to-semiconductor transition 11-1 within said mesa zone 124. Said single first-load-contact-to-semiconductor transition 11-1 can be formed by a transition between the semiconductor source region 121-3 and the first load contact 11. Further, said first-load-contact-to-semiconductor transition 11-1 may exhibit an area that is arranged in parallel to said extension direction Z so that the load current, when crossing said first-load-contact-to-semiconductor transition 11-1 flows in a direction perpendicular to said extension direction Z, e.g., in a horizontal direction. For example, the load current in the forward direction enters or, respectively leaves the mesa zone 124 by crossing said single first-load-contact-to-semiconductor transition 11-1 that is arranged above the trench 14a, but, e.g., not above the trench 14b. Thus, the load current may enter or, respectively leave the mesa zone 124 only at one sidewall of one of the trenches 14a, 14b that define the mesa zone 124, e.g., only in vicinity to the trench electrode 141a, and not in vicinity to the trench electrode 141b, i.e., not at one or more central points of the upper boundary of the mesa zone 124 defined by said insulation region 151 along a first lateral direction Y. For example, the insulator 142b of the trench 14b may be arranged so as to insulate the first load contact 11 from the mesa zone 124, as illustrated in FIG. 1A, wherein other configurations of the insulator 142b are also possible, which will be explained in more detail with regards to FIGS. 3 and 4. In contrast, the insulator 142a of the trench 14a may be arranged such that said first-load-contact-to-semiconductor transition 11-1 may be established between the semiconductor source region 121-3 and the first load contact 11.

Further, the established load current path for conduction of the load current in the forward direction may further comprise said pn-junction that can be formed by a transition between the semiconductor body region 121-1 and the semiconductor source region 121-3, as explained above.

It shall be noted that the term "inversion channel", as used within the specification, intends to describe a type of charge carrier being present within the semiconductor body region 121-1. For example, if the semiconductor body region 121-1 exhibits dopants of the second conductivity type, e.g., acceptors, said single inversion channel included in the established load current path may be substantially formed by electrons. In another embodiment, if the semiconductor body region 121-1 exhibits dopants of a first conductivity type, e.g., donors, said single inversion channel may be substantially formed by holes.

As illustrated in FIG. 1A, the semiconductor device 1 may further comprise a control electrode 15 arranged above said first semiconductor contact zone 121, i.e., above the mesa zone 124. The control electrode 15 can be electrically insulated from both the first load contact 11 and the second load contact 13. To this end, the control electrode 15 may be surrounded by an insulation region 151, wherein the insulation region 151 may be in contact with the first semiconductor contact zone 121 and be arranged above said mesa zone 124. Further, the control electrode 15 can be electrically insulated from the trench electrodes 141a and 141b.

Further, the control electrode 15 may exhibit a planar structure that is aligned to the first semiconductor contact zone 121 with respect to said extension direction Z so as to cover at least a part of the first semiconductor contact zone 121, e.g., at least a part of the semiconductor source region 121-3 and a part of the semiconductor body region 121-1. For example, each of the semiconductor source region 121-3, the semiconductor body region 121-1 and the control electrode 15 exhibit an overlap in the first lateral direction Y.

It shall be noted that the term "planar structure", as used herein, may refer to a structure that is arranged above said first semiconductor contact zone 121 and, e.g., not arranged laterally, i.e., in said first lateral direction Y, adjacent to said first semiconductor contact zone 121. In an embodiment, the control electrode 15 is arranged above said first semiconductor contact zone 121 such that it covers at least a part of said first semiconductor contact zone 121, e.g., at least a part of the semiconductor body region 121-1, at least a part of the semiconductor source region 121-3 and a section of said semiconductor drift zone 122 that is included in the mesa zone 124. Thus, there may be an overlap along said first lateral direction Y of the lateral extension of the control electrode 15 on the one side and of the lateral extensions of the semiconductor source region 121-3, the semiconductor body region 121-1 and of the semiconductor drift region 122 on the other side. Further, "planar structure" may refer to a structure that is entirely arranged above the semiconductor region 12.

For example, the control electrode 15 may be electrically connected to a gate terminal (not illustrated in FIG. 1A) of the semiconductor device 1. Further, the first load contact 11 may form a part of or be electrically connected to a source terminal (not illustrated in FIG. 1A) of the semiconductor device 1, and the second load contact 13 may form a part of or be electrically connected to a drain terminal (not illustrated in FIG. 1A) of the semiconductor device 1. For example, the semiconductor device 1 is arranged and configured for establishing said load current path for conduction of said load current in the forward direction in dependence of a difference between an electrical potential of the control electrode 15 and an electrical potential of said first load contact 11. For example, said difference may be generated by applying a voltage between the first load contact 11 and the control electrode 15. Such voltage may, e.g., be provided by a gate driver (not illustrated) coupled to the semiconductor device 1.

As will be explained in more detail with regards to FIGS. 5 to 7, the control electrode 15 may be, in accordance with an embodiment, electrically coupled to a contact pad of the semiconductor device 1 by means of a contact runner and by means of one of a connector electrode of a connector trench and a connector layer, wherein said contact pad may be arranged to be contacted by a bond wire or a clip for receiving a control signal, e.g., a gate signal provided by a gate driver. Further aspects of this optional feature of the semiconductor device 1 will be explained below.

For example, at least one of the trench electrodes 141a and 141b may be in contact with the first load contact 11. Thus, the trench electrodes 141a and 142b may exhibit substantially the same electrical potential as the first load contact 11. For example, each of said trench electrodes 141a and 141b comprises a field plate electrode. Said field plate electrodes may each be arranged perpendicular to the planar structure of the control electrode 15. Further, each of said trench electrodes 141a and 141b may be a single monolithic electrode. Also, as schematically illustrated in FIG. 1A, each of the trench electrodes 141a and 141b may extend further into the semiconductor region 12 along said extension direction Z as compared to the first semiconductor contact zone 121.

In an embodiment, a distance P, also referred to as "pitch", between said two trenches 14a and 14b in said first lateral direction Y that is perpendicular to said extension direction Z amounts to less than 3 μm, e.g., to less than 2 μm, or even to less than 1 μm. In an embodiment, the pitch P may amount to less than 0.5 μm. Such low pitch may allow for a reduction of both the on-state resistance of the semiconductor device 1 as well as a reduction of the output charge of the semiconductor device 1. For example, within said cross-section of the mesa zone 124, there is only arranged a single first semiconductor contact zone 121 due to the low pitch P, i.e., only a single semiconductor source region 121-3. That is to say, within said vertical cross-section of the mesa zone 124, there may be arranged only one coherent semiconductor source region 121-3. Thus, the semiconductor device 1 may exhibit an asymmetrical structure within said mesa zone 124, since, as explained above, the load current in the forward direction enters or, respectively leaves the mesa zone 124 by crossing said single first-load-contact-to-semiconductor transition 11-1 that is arranged above the trench 14a, but, e.g., not above the trench 14b. Thus, the load current may enter or, respectively leave the mesa zone 124 only at one sidewall of one of the trenches 14a, 14b that define the mesa zone, e.g., only in vicinity to the trench electrode 141a and not in vicinity to the trench electrode 141b, i.e., not in the middle of the mesa zone 124. For example, the insulator 142b of the trench 14b may be arranged so as to insulate the first load contact 11 from the mesa zone 124, as illustrated in FIG. 1A. In contrast, insulator 142a of the trench 14a may be arranged such that said first-load-contact-to-semiconductor transition 11-1 may be established between the semiconductor source region 121-3 and the first load contact 11. Accordingly, the structure as schematically illustrated in FIG. 1A may then exhibit, in the vertical cross-section, only one inversion channel.

In accordance with an embodiment, the width $W_M$ of the mesa zone 124 along said first lateral direction Y amounts to less than 3.0 μm, to less than 1.5 μm, to less than 1 μm, or even to less than 0.5 μm. For example, said width $W_M$ is measured as a distance between the sidewalls of the trenches 14a and 14b that laterally confine said mesa zone 124, wherein said distance may be measured at a level of the transition between said semiconductor body region 121-1 and said semiconductor drift zone 122, for example at a deepest point of said transition with regards to said extension direction Z, as schematically illustrated in FIG. 1A. Said pitch P may also be determined at said deepest point.

Further, said width $W_M$ of the mesa zone 124 may be smaller as compared to the width $W_T$ along said lateral direction of each of the trenches 14a and 14b, wherein said width $W_T$ along said lateral direction of each of the trenches 14a and 14b may be measured at a level of the transition between said semiconductor body region 121-1 and said semiconductor drift zone 122, for example at a deepest point of said transition with regards to said extension direction Z, as schematically illustrated in FIG. 1A.

In accordance with an embodiment, each insulator 142a and 142b of the trenches 14a and 14b may exhibit, in said first lateral direction Y, a homogenous, e.g., a constant thickness along substantially the total extension of the respective trench in the extension direction Z. This may allow for a reduction of the complexity of the manufacturing process. In another embodiment, said insulator thickness may increase along the extension direction Z at least partially.

For example, some of the components illustrated in FIG. 1A of the semiconductor device 1 may form a part of a transistor cell that is configured to carry said load current in the forward direction, such as the trenches 14a, 14b, the control electrode 15 and the first semiconductor contact zone 121.

Figure 1B:
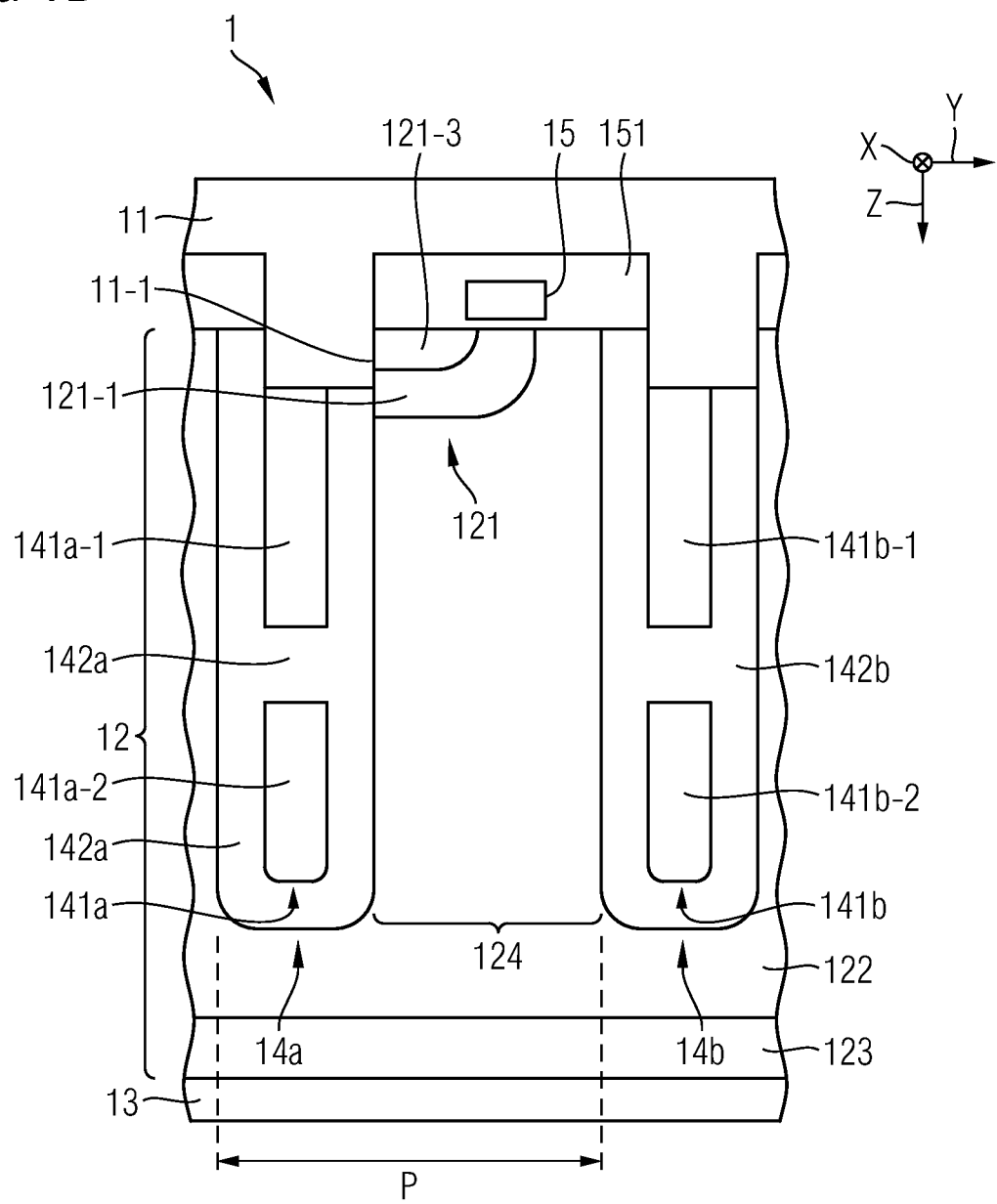
FIG. 1B schematically illustrates a section of a vertical cross-section of a semiconductor device having a multi-part trench electrode according to one or more embodiments.

FIG. 1B schematically illustrates a section of a vertical cross-section of a semiconductor device 1 having multi-part trench electrodes 141a and 141b according to one or more embodiments. Besides said trench electrodes 141a and 141b, the semiconductor device 1 illustrated in FIG. 1B is substantially identical to the semiconductor device 1 illustrated in FIG. 1A. In so far, the description of FIG. 1A also applies to FIG. 1B. In accordance with the embodiment of FIG. 1B, the trench electrodes 141a and 141b comprise a respective first electrode part 141a-1, 141b-1 as well as a respective second electrode part 141a-2, 141b-2. These two parts may be electrically insulated from each other by means of said insulator 142a or, respectively, 142b.

Said first electrode parts 141a-1 and 141b-1 may be arranged in an upper region of the respective trench 14a, 14b and may both be in contact with the first load contact 11. Thus the first electrode parts 141a-1 and 141b-1 may exhibit the same electrical potential as the first load contact 11.

The second electrode parts 141a-2 and 141b-2 may each be arranged in a bottom region of the respective trench 14a, 14b. These parts may either also be electrically connected to the first load contact 11 and thus exhibit the same electrical potential as the first load contact 11 or, respectively, said second electrode parts 141a-2 and 141b-2 may be electrically insulated from the first load contact 11. In the latter case, another electrical potential can be applied to the second electrode parts 141a-2 and 141b-2. For example, said second electrode parts 141a-2 and 141b-2 may be electrically coupled to the first load contact 11 by means of a path that exhibits a higher Ohmic resistance than an electrical connection between the first electrode parts 141a-1, 141b-1 and the first load contact 11. For example, the higher Ohmic resistance may allow for reducing the magnitude of voltage and/or current transients, e.g., during switching operation of the semiconductor device 1. Said path can be established, e.g., by means of at least a connector trench, wherein exemplary embodiments of such type of a trench will be explained in more detail with respect to FIG. 5 and FIG. 6. Thus, in accordance with an embodiment, said connector trench (not illustrated in FIG. 1B) that may couple the second electrode parts 141a-2 and 141b-2 to the first load contact 11 can extend into the semiconductor region 12 along said extension direction Z and may include a connector electrode that may also extend along said extension direction Z. Both the second electrode parts 141a-2, 141b-2 and the first load contact 11 may be electrically connected to said connector electrode. Further, the connector electrode can comprise a resistance region exhibiting a locally increased Ohmic resistance so as to increase a total Ohmic resistance in said path that electrically couples the first load contact 11 to the second electrode parts 141a-2, 141b-2. For example, the resistance region of the connector electrode is produced by a locally decreased cross-section area of the connector electrode.

Such multi-part trench electrodes 141a and 141b may further allow for a reduced thickness of the respective insulator 142a, 142b in an upper region of the respective trench 14a, 14b, which may lead to an increased compensation and, thus, to a reduced on-state resistance of the semiconductor device 1.

Figure 2A:
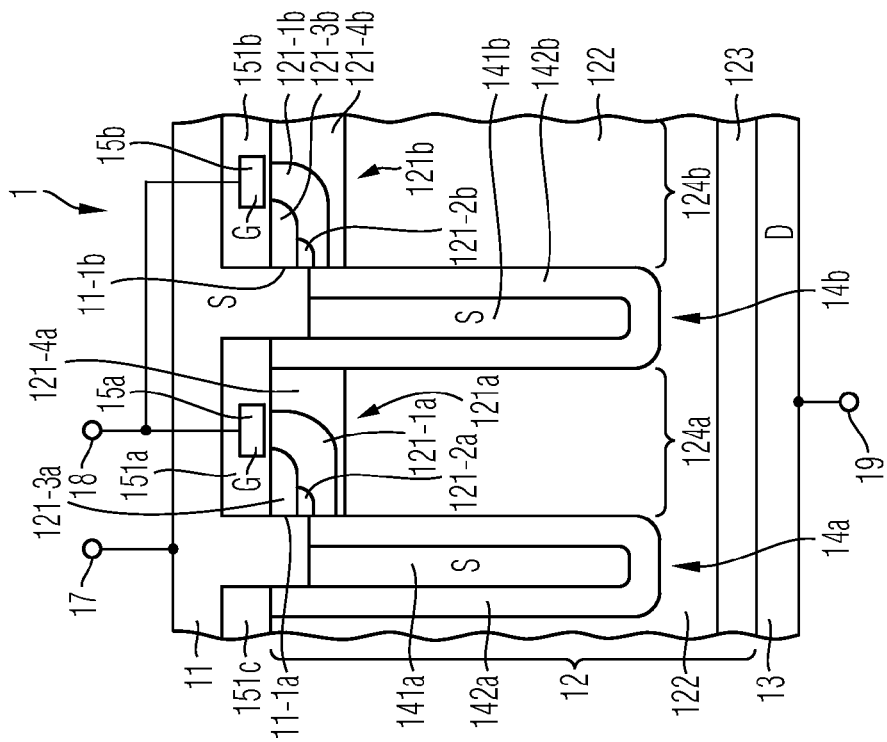
FIG. 2A schematically illustrates a section of a vertical cross-section of a semiconductor device according to one or more embodiments.
Figure 2B:
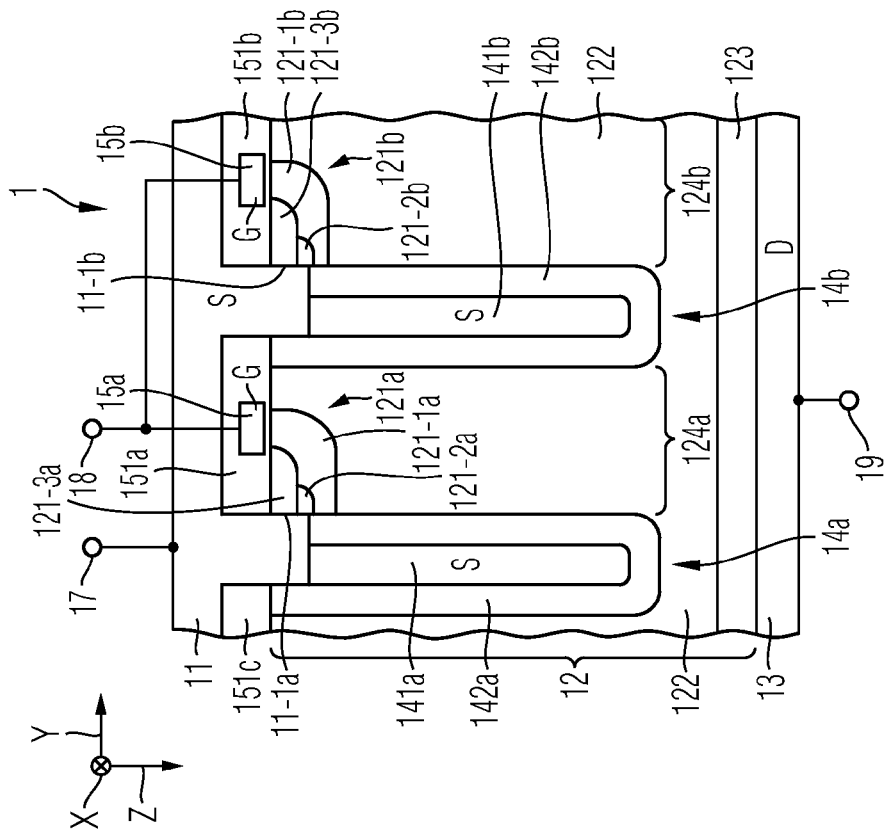
FIG. 2B schematically illustrates a section of a vertical cross-section of a semiconductor device having a current-spread region according to one or more embodiments.
Figure 2C:
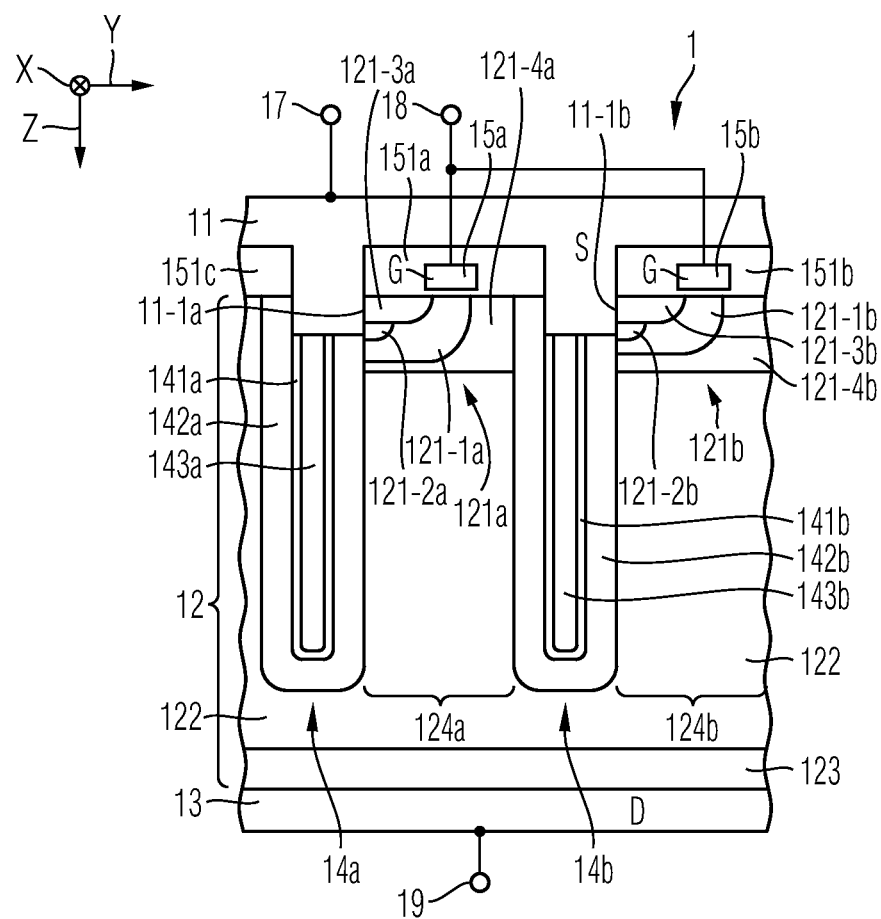
FIG. 2C schematically illustrates a section of a vertical cross-section of a semiconductor device having a trench with an interior region of a non-conducting material according to one or more embodiments.

FIG. 2A to FIG. 2C each schematically illustrate a section of a vertical cross-section of a semiconductor device 1 in accordance with one or more embodiments. However, the principle setup of each of the semiconductor devices illustrated in FIG. 2A to FIG. 2C essentially corresponds to the setup of the semiconductor device 1 illustrated in FIG. 1A. Thus, what has been stated above with regards to the embodiment as illustrated in FIG. 1A may also apply to the semiconductor device 1 illustrated in FIG. 2A to FIG. 2C, if not stated otherwise.

In accordance with the embodiments illustrated in FIG. 2A to FIG. 2C, the semiconductor device 1 may comprise a first load terminal 17 electrically connected to the first load contact 11. For example, the first load terminal 17 is a source (S) terminal of the semiconductor device 1. Further, the semiconductor device 1 may comprise a second load terminal 19 electrically connected to the second load contact 13. For example, the second load terminal 19 is a drain (D) terminal of the semiconductor device 1. Further, the semiconductor device 1 may comprise a control terminal 18 connected to the control electrodes 15a and 15b. For example, the control terminal 18 is a gate (G) terminal of the semiconductor device 1. Each of the control electrodes 15a and 15b may exhibit a planar structure, e.g., each of the control electrodes 15a and 15b may be arranged entirely above said semiconductor region 12.

In an embodiment, the semiconductor device 1 may be controlled by applying a voltage between the first load terminal 17 and the control terminal 18. Thus, the semiconductor device 1 may be arranged and configured for establishing said load current path in dependence of the voltage applied to the first load terminal 17 and the control terminal 18. For example, the load current can be received and output by means of said load terminals 17 and 19.

As illustrated in FIG. 2A to FIG. 2C, the semiconductor device 1 may exhibit a plurality of mesa zones 124a, 124b, wherein each mesa zone 124a, 124b is arranged between two respective trenches, e.g., mesa zone 124a is arranged between trenches 14a and 14b. Further, as explained with respect to FIG. 1A, each mesa zone 124a, 124b may comprise a first semiconductor contact zone 121a, 121b. Each first semiconductor contact zone 121a and 121b may comprise a semiconductor source region 121-3a, 121-3b. For example, within the vertical cross-section of each mesa zone 124a and 124b, there is only arranged one respective coherent semiconductor source region 121-3a, 121-3b. Thus, in accordance with an embodiment, there may only be one first-load-contact-to-semiconductor transition 11-1a and 11-1b within each mesa zone 124a, 124b. Above each mesa zone 124a and 124b, there may be arranged a respective control electrode 15a and 15b. As explained with respect to FIG. 1A, each of said control electrodes 15a and 15b may exhibit said planar structure. Further, each control electrode 15a and 15b may be insulated from the semiconductor region 12 by a respective insulation region 151a, 151b, 151c. Each control electrode 15a and 15b may be electrically connected to said control terminal 18 of the semiconductor device 1 and may be electrically insulated from both the first load contact 11 and the second load contact 13.

The semiconductor device 1 may include a plurality of transistor cells formed by a respective pair of trenches 14a, 14b, the control electrode 15a arranged above the mesa zone 124a that is laterally confined by said pair of trenches 14a, 14b, and the first semiconductor contact zone 121a arranged within the mesa zone 124a, wherein said plurality of transistor cells may be arranged adjacent to each other along said first lateral direction Y and may each extend along the second lateral direction X, thereby yielding, e.g., a stripe cell configuration of the semiconductor device 1. In another embodiment, the arrangement of said cells may exhibit a grid pattern. The extension in the second lateral direction X, however, is not illustrated in FIG. 1A-4. Thus, each of the trenches 14a and 14b may exhibit one of the following forms: a stripe form (wherein, e.g., the total extension along the second lateral X direction is at least a multiple of the total extension along said extension direction Z), a needle form (wherein, e.g., the total extensions along the first and second lateral directions X and Y are similar to each other and both smaller than the total extension along said extension direction Z) and a grid form (wherein, e.g., the trench electrodes exhibit plate sections arranged substantially perpendicular to each other, e.g., arranged in XZ-planes and in YZ-planes).

In accordance with the embodiments schematically illustrated in FIG. 2A-2C, the first semiconductor contact zones 121a and 121b may each comprise a semiconductor source region 121-3a, 121-3b and a semiconductor body region 121-1a, 121-1b, wherein the semiconductor body regions 121-1a and 121-1b may isolate said semiconductor source regions 121-3a and 121-3b from the semiconductor drift zone 122. For example, a transition between the semiconductor body region 121-1a and the semiconductor source region 121-3a forms a first pn-junction, and a transition between the semiconductor body region 121-1b and the semiconductor source region 121-3b may form a second pn-junction. Further, each first semiconductor contact zone 121a and 121b may include a semiconductor connector region 121-2a, 121-2b. For example, the semiconductor connector regions 121-2a and 121-2b are in contact with the first load contact 11 on the one side and in contact with said semiconductor body regions 121-1a, 121-1b on the other side. The semiconductor body regions 121-1a, 121-1b, the semiconductor connector regions 121-2a and 121-2b may exhibit dopants of a conductivity type complementary to the conductivity type of the dopants being present in the semiconductor source regions 121-3a and 121-3b. For example, the semiconductor source regions 121-3a and 121-3b are $n^+$-regions and the semiconductor body regions 121-1a and 121-1b are p-regions and the semiconductor connector regions 121-2a and 121-2b are $p^+$-regions.

For instance, as explained above, there is only one single inversion channel, in a vertical cross-section of said mesa zones 124a and 124b, included in the respective semiconductor body region 121-1a, 121-1b. As illustrated in the Figures, said vertical cross-section may be in parallel to the plane defined by said extension direction Z and said first lateral direction Y.

In accordance with the embodiment schematically illustrated in FIG. 2B, the semiconductor drift zone 122 may comprise, within each mesa zone 124a, 124b, a semiconductor current-spread region 121-4a, 121-4b. Said regions 121-4a and 121-4b may be configured to spread said load current, which may allow for achieving a more homogeneous load current density within said mesa zones 124a and 124b, which may result in a reduced on-state resistance of the semiconductor device 1. The semiconductor current-spread regions 121-4a and 121-4b may be arranged in upper regions of the mesa zones 124a, 124b and be in contact with the respective semiconductor body region 123-1a, 123-1b. For example, the semiconductor current-spread regions 121-4a and 121-4b may be doped with dopants of the first conductivity type. For example, the semiconductor current-spread regions 121-4a and 121-4b are n-regions. For example, the doping concentration of the semiconductor current-spread regions 121-4a and 121-4b is higher than the doping concentration of the remaining semiconductor drift zone 122, which may be an $n^-$-region. In accordance with an embodiment, the semiconductor current-spread region 121-4a may extend, in said first lateral direction Y, from the insulator 141a of trench 14a to the insulator 141b of trench 14b. In other words, the semiconductor current-spread region 121-4a may exhibit substantially the same width $W_M$ as the mesa zone 124a. The same applies to the adjacent semiconductor current-spread region 121-4b of the neighboring cell.

Further, as schematically illustrated in FIG. 2B, the control electrodes 15a, 15b may be arranged such that they also cover at least a section of said current-spread regions 124a, 124b. Accordingly, there may be an overlap along said first lateral direction Y of the lateral extension of the respective control electrode 15a, 15b on the one side and of the lateral extension of the respective semiconductor source region 121-3a, 121-3b, the respective semiconductor body region 121-1a, 121-1b and of the respective semiconductor current-spread region 121-4a, 121-4b on the other side.

Further, said semiconductor current-spread regions 121-4a, 121-4b can be created, e.g., by means of an implantation process that may be self-aligned with respect to said control electrodes 15a, 15b. This may allow for a well-defined overlap between said current-spread regions 121-4a, 121-4b and said control electrodes 15a, 15b along said first lateral direction Y. Such overlap may allow for a precise control of the gate-drain charge of the semiconductor device 1. In an embodiment, the gate electrodes 15a, 15b themselves may serve as an implantation mask for said implantation process. Further, an additional thin layer and/or a spacer, such as a spacer made of at least one of oxide and nitride, may be provided at said gate electrodes 15a, 15b for broadening said masking.

Regarding the embodiment schematically illustrated in FIG. 2C, the trenches 14a and 14b may exhibit interior regions 143a and 143b, wherein each of the interior region 143a and 143b may be surrounded by the respective trench electrode 141a, 141b. For example, the interior regions 143a and 143b may be formed by an oxide. Further, said interior regions 143a and 143b may extend along said extension direction Z for almost as far as the trench electrodes 141a and 141b that surround said interior regions 143a and 143b. For example, such interior regions 143a and 143b may allow for a reduced mechanical stress and/or to a decreased wafer bow.

Figure 3:
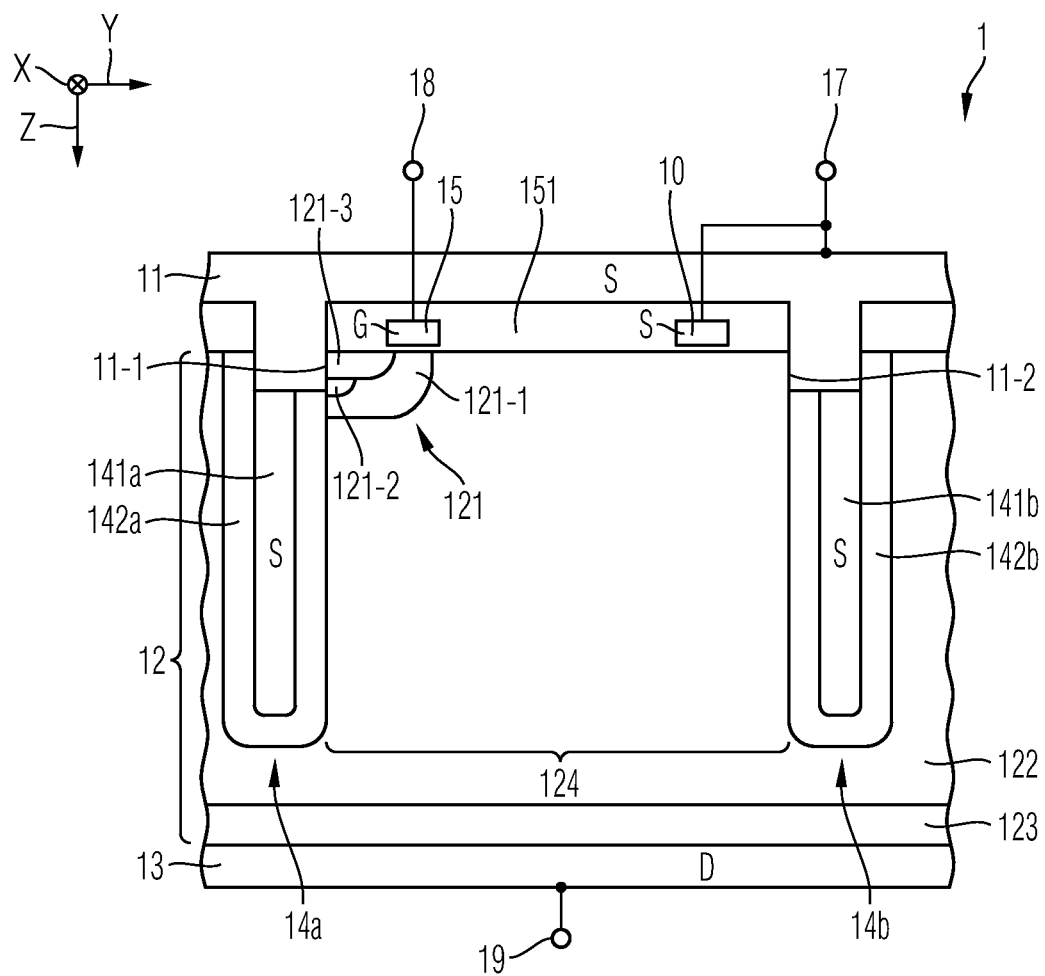
FIG. 3 schematically illustrates a section of a vertical cross-section of a semiconductor device having a planar source electrode according to one or more embodiments.

Referring now to the embodiment schematically illustrated in FIG. 3, the semiconductor device 1 may further comprise a source electrode 10 arranged above said mesa zone 124 and separately from the control electrode 15. For example, the source electrode 10 is electrically insulated from the control electrode 15, e.g., by means of said insulation region 151. Further, said source electrode 10 may be electrically connected to the first load contact 11. Both, the source electrode 10 and the first load contact 11 may be electrically connected to said source terminal 17. As the control electrode 15, the source electrode 10 may also exhibit a planar structure. In an embodiment, both the control electrode 15 and the source electrode 10 may exhibit the same planar structure, e.g., the control electrode 15 and the source electrode 10 may exhibit identical spatial dimensions. Further, the control electrode 15 and the source electrode 10 may be arranged, with respect to said extension direction Z, at the same level.

In accordance with the embodiment of illustrated in FIG. 3, a further first-load-contact-to-semiconductor transition 11-2 is formed between a section of the first load contact 11 arranged above the trench 14b and the second mesa zone 124. But, for example, this further transition 11-2 does not form a part of the established load current path for conduction of the load current in the forward direction. For example, said further transition 11-2 may be used for carrying a load current in a reverse direction opposite to said forward direction.

Figure 4:
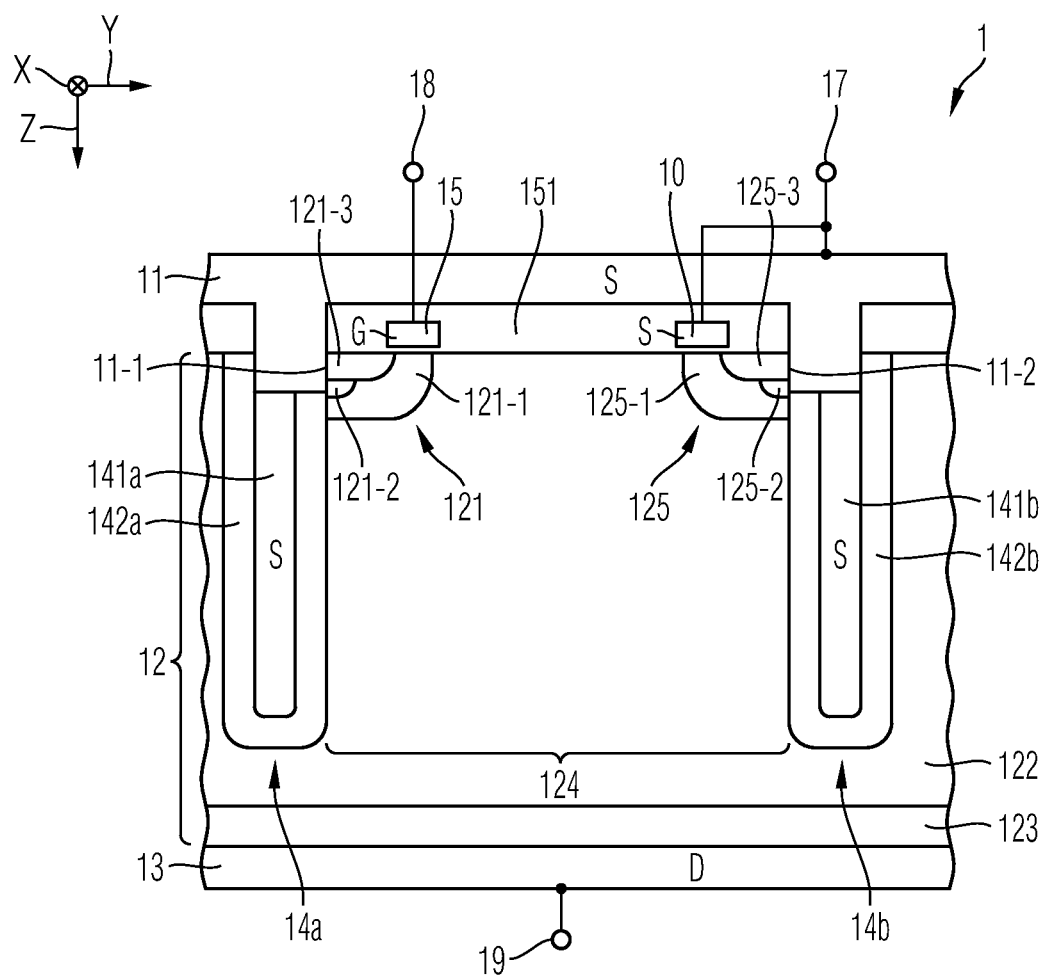
FIG. 4 schematically illustrates a section of a vertical cross-section of a semiconductor device having a third semiconductor contact zone according to one or more embodiments.

Regarding now in more detail the embodiments schematically illustrated in FIG. 4, the semiconductor device 1 may further comprise, within said mesa zone 124, a third semiconductor contact zone 125. Further, the third semiconductor contact zone 125 may exhibit a similar setup as the exemplary setup of the first semiconductor contact zone 121. Accordingly, the third semiconductor contact zone 125 may also comprise a semiconductor body region 125-1, a semiconductor connector region 125-2 and a semiconductor source region 125-3. Both the semiconductor body region 125-1 and the semiconductor connector region 125-2 can be doped with dopants of the second conductivity type. For example, the semiconductor body region 125-1 is a p-region and the semiconductor connector region 125-2 is a p$^+$-region. The semiconductor connector region 125-2 may be in contact with the first load contact 11, as illustrated in FIG. 4. The semiconductor source region 125-3 of the third semiconductor contact zone 125 may also be in contact with the first load contact 11 and be isolated from the semiconductor drift zone 122 by means of said semiconductor body region 125-1. For example, the semiconductor source region 125-3 is doped with dopants of the first conductivity type. For example, the semiconductor source region 125-3 is an n$^+$-region. As illustrated in FIG. 4, the third semiconductor contact zone 125 can be arranged separately from the first semiconductor contact zone 121. In another embodiment, the semiconductor body region 121-1 of the first semiconductor contact zone 121 and the semiconductor body region 125-1 of the third semiconductor contact zone 125 are formed by means of common coherent semiconductor region (not illustrated).

The source electrode 10 may be arranged above said third semiconductor contact zone 125, e.g., such that the extensions of the semiconductor source region 125-3 and the control electrode 10 exhibit an overlap in said first lateral direction Y. For example, the source electrode 10 is arranged above said third semiconductor contact zone 125 such that it covers at least a part of said third semiconductor contact zone 125, e.g., at least a part of the semiconductor body region 125-1, at least a part of the semiconductor source region 125-3, and a section of said semiconductor drift zone 122 that is included in the mesa zone 124. Thus, there may be an overlap along said first lateral direction Y of the lateral extension of the source electrode 10 on the one side and of the lateral extensions of the semiconductor source region 125-3, the semiconductor body region 125-1 and of the semiconductor drift region 122 on the other side.

In accordance with the embodiment illustrated in FIG. 4, the semiconductor device 1 may exhibit a substantially symmetrically arranged cell formed by the two trenches 14a and 14b, the control electrode 15, the source electrode 10 and the first semiconductor contact zone 121 and the third semiconductor contact zone 125, which may facilitate manufacturing of the semiconductor device 1.

For example, the first semiconductor contact zone 121 may be controlled by applying a voltage between said control electrode 15 and said first load contact 11, and the third semiconductor contact zone 125 may be controlled by applying a voltage between the source electrode 10 and the second load contact 13.

Whereas the left part of the cell including the control electrode 15, the first semiconductor contact zone 121 and the trench 14a may form at least a part of a transistor cell, the right part of the cell including the source electrode 10, the trench 14b and the third semiconductor contact zone 125 may form at least a part of a diode cell. Said right part of the cell may be operated as a MOS Gated Diode (MGD), e.g., for carrying a load current in the reverse direction. Thus, the semiconductor region 12 may also be configured to conduct a load current between the first load contact 11 and the second load contact 13 in a reverse direction opposite to said forward direction. In accordance with an embodiment, a thickness of the insulation region 151 and/or a doping concentration of the semiconductor body region 125-1 is chosen such that, within a reverse current mode of the semiconductor device 1, a current path for carrying the reverse load current is created before the diode established within the third semiconductor contact zone 125 or within the first semiconductor contact zone 121 injects charge carriers. For example, the thickness, in said extension direction Z, of the insulation region 151 between the source electrode 10 and the third semiconductor contact zone 125 is within the range of 5 nm to 10 nm.

For example, the semiconductor device 1 may be configured to establish a further load current path for conduction of the load current in the reverse direction in dependence of a difference between an electrical potential of the second load contact 13 and an electrical potential of the first load contact 11. Said further load current path may comprise, in the schematically illustrated vertical cross-section of the mesa zone 124, at least one of an inversion and an accumulation channel included in said third semiconductor contact zone 125. For example, said further load current path may include the second transition 11-2 formed between the first load contact 11 and the semiconductor source region 125-3 of the third semiconductor contact zone 125.

The second semiconductor contact zone 123 that may couple the semiconductor drift zone 122 to the second load contact 13 and may be doped with dopants of the first conductivity type. For example, the second semiconductor contact zone 123 is an $n^{++}$-region. If the semiconductor drift zone 122 is $n^-$-doped, the semiconductor body region 121-1 p-doped, the semiconductor connector region 121-2 $p^+$-doped and the semiconductor source region 121-3 is $n^+$-doped, the third semiconductor contact zone 123 may be $n^{++}$-doped, e.g., for forming a MOSFET structure. With otherwise unchanged doping types, the third semiconductor contact zone 123 may be p-doped, e.g., for forming an IGBT structure.

Figure 5:
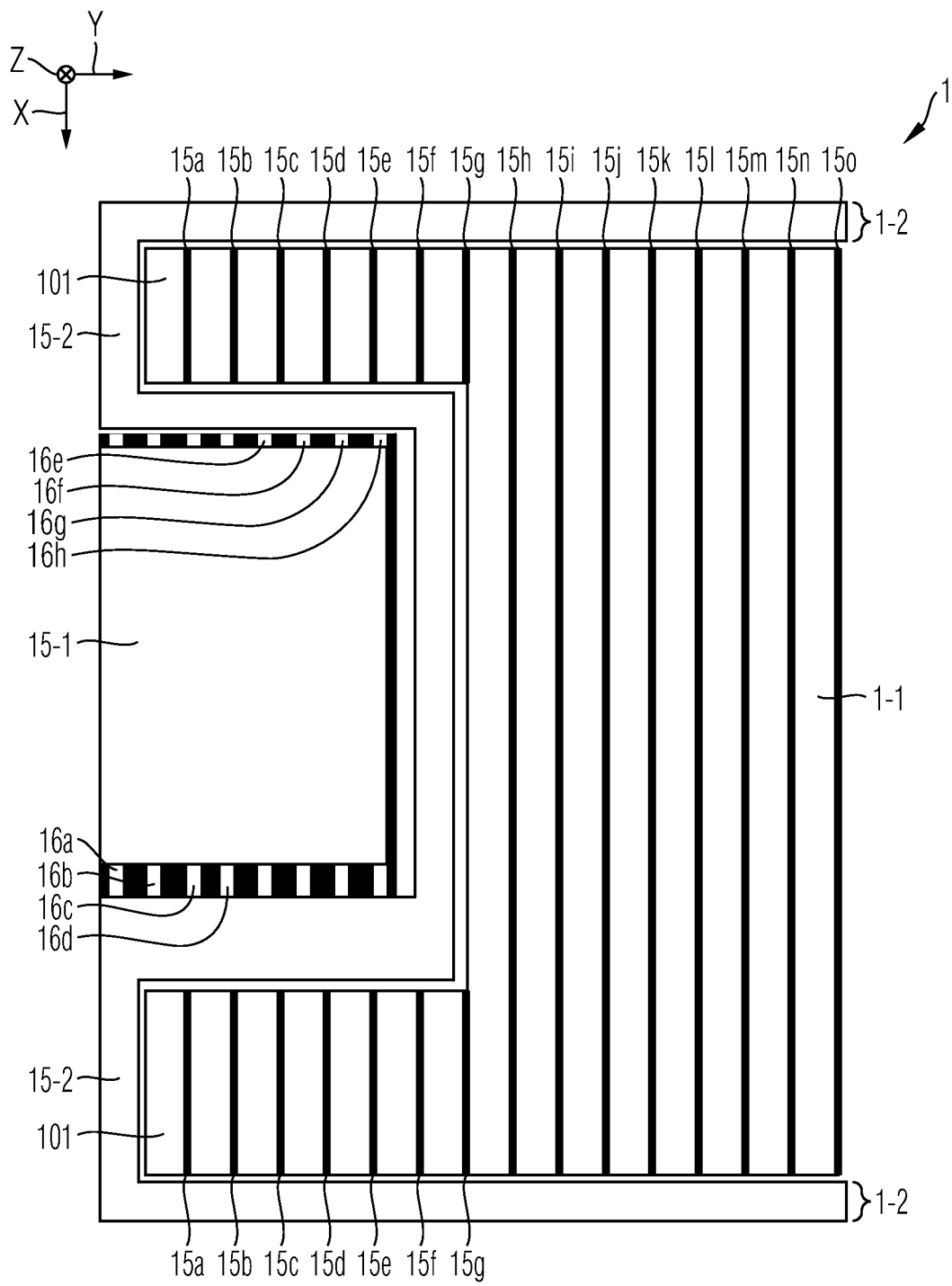
FIG. 5 schematically illustrates a section of a horizontal projection of a semiconductor device according to one or more embodiments.

FIG. 5 schematically illustrates a horizontal projection of yet a further embodiment of a semiconductor device 1. The embodiment of the semiconductor device 1 schematically illustrated in FIG. 5 may exhibit some or all of the features of one or more of the embodiments of the semiconductor device 1 illustrated in FIG. 1A to FIG. 4. Accordingly, the semiconductor device 1 may include a plurality of said cells, when each cell may comprises a respective control electrode 15a, 15b, . . . , 15o. Each of the control electrodes 15a, 15b, . . . , 15o may exhibit a planar structure, e.g., each of the control 15a, 15b, . . . , 15o may be arranged entirely above said semiconductor region 12. The first load contact 11 and the second load contact 13 as well as the semiconductor region 12 coupling the first load contact 11 to the second load contact 13 is not illustrated in FIG. 5.

The semiconductor device 1 exhibits a surface region 101 arranged above the semiconductor region 12 and mechanically coupled to said semiconductor region 12. The control electrodes 15a-15o can be arranged within said surface region 101, i.e., above the semiconductor region 12. Further, the semiconductor device 1 may include a contact runner 15-2 that is also arranged within said surface region 101 and, in accordance with the embodiment illustrated in FIG. 5, electrically connected to each of the control electrodes 15a to 15o.

For example, the semiconductor device 1 exhibits an edge region 1-2 that surrounds an active region 1-1 of the semiconductor device 1, wherein said contact runner 15-2 may be arranged within the edge region 1-2 of the semiconductor device 1. Further, the contact runner 15-2 may essentially follow the course of the edge region 1-2. For example, the active region 1-1 is a region on a semiconductor device chip in which there is arranged a plurality of active IGBT cells or MOSFET cells designed in a manner as exemplarily described with regards to FIG. 1A to 4. The edge region 1-2 may be a non-active region, e.g., a region where there are no or, respectively, only a very few active cells. For example, the load current is carried by the semiconductor device 1 mainly by means of the active region 1-1 of the semiconductor region 12, but not by the edge region 1-2.

As already explained with regards to FIG. 1A, the semiconductor device 1 may further comprise a contact pad 15-1 that is also arranged within the surface region 101, i.e., above the semiconductor region 12. For example, the contact pad 15-1 is placed separately from the contact runner 15-2. The contact pad 15-1 may be arranged to be contacted by a bond wire or a clip and may form at least a part of said control terminal 18 (cf. FIGS. 2A-4). By means of said bond wire or clip, a control signal, such as a gate signal, can be provided to said contact pad 15-1.

For example, in accordance with the embodiment illustrated in FIG. 5, within the surface region 101, there is no electrical connection arranged that electrically connects the contact runner 15-2 directly to the contact pad 15-1. Rather, the semiconductor device 1 may comprise a number of connector trenches 16a-16h that extend into the semiconductor region 12 along said extension direction Z. Each of the connector trenches 16a-16h may include a connector electrode (not illustrated). Both the contact pad 15-1 and the contact runner 15-2 may be electrically connected to the connector electrodes of the connector trenches 16a to 16h. It shall be understood that only one of the connector trenches 16a to 16h may be sufficient for electrically coupling the contact pad 15-1 to the contact runner 15-2. For example, a specific resistance between the contact pad 15-1 and the contact runner 15-2, i.e., a specific resistance between the contact pad 15-1 and the control electrodes 15-a to 15-o, may be adjusted by means of the structure, the material and/or the spatial dimensions of the connector electrodes of the connector trenches 16a to 16h. For example, a specific gate series resistance can be adjusted. For example, said connector electrode comprises a resistance region exhibiting a locally increased Ohmic resistance so as to increase a total Ohmic resistance in a path that couples the contact pad 15-1 to the control electrodes 15a to 15o. For example, such resistance regions of the connector electrodes of the connector trenches 16a to 16h may be produced by a locally decreased cross-section area of the respective connector electrode. Specific examples of producing a locally increased Ohmic resistance are described in US patent application U.S. Ser. No. 13/970,162, the content of which is incorporated herein in its entirety.

Said connector trenches 16a to 16h may exhibit an extension along said first lateral direction X that is larger than the extension of the contact pad 15-1 in said first lateral direction. Both the contact pad 15-1 and at least a section of the contact runner 15-2 may be arranged, within said surface region 101, above the connector trenches 16a to 16h, e.g., entirely above the semiconductor region 12.

For example, both the trenches that are used for forming said cells, e.g., trenches 14a and 14b, and the connector trenches 16a to 16h are formed within the same manufacturing steps. Thus, the trenches 14a, 14b and the connector trenches 16a to 16h may exhibit the same trench depth, i.e., the same extension along said extension direction Z, and/or the same trench width along said first lateral direction Y. Further, the connector electrodes of the connector trenches 16a to 16h may be formed out of the same material as the trench electrodes 141a and 141b. The same applies for the insulation of the electrodes within said trenches. Accordingly, also said connector trenches 16a to 16h may include insulators that insulate respective connector electrodes from the semiconductor region 12. Said insulators may be formed out of the same material as the insulators 142a and 142b. Further, the spatial dimensions of the insulators and/or of the trench electrodes of the trenches that are used for forming said cells, e.g., of trenches 14a and 14b, can be essentially identical to the spatial dimensions of the insulators and connector electrodes of said connector trenches 16a to 16d, at least along at least one of said extension direction Z and said first lateral direction Y.

As elaborated with respect to the embodiments illustrated in FIG. 1A to FIG. 4, also the control electrodes 15a-15o of the embodiment illustrated in FIG. 5 may be electrically insulated from both the first load contact 11 and the second load contact 13. Each of the control electrodes 15a-15o may exhibit a planar structure, e.g., a planar stripe structure, that is arranged substantially perpendicular to said extension direction Z. Further, as illustrated in FIG. 1A to FIG. 4, the semiconductor region 12 may include a plurality of mesa zones 124a, 124b, wherein each of the mesa zones can be arranged between respective two adjacent trenches of said plurality of trenches (cf. trenches 14a and 14b). Above each mesa zone 124a, 124b there may be arranged a respective control electrode 15a, . . . , 15o, as, e.g., schematically illustrated in FIG. 2A. Further, each of said control electrodes 15a to 15o may be arranged so as to cover at least a part of the first semiconductor contact zones 121a, 121b that may be arranged within said mesa zones 124a, 124b.

In addition or in alternative to the connector trenches 16a to 16h that electrically connect the contact pad 15-1 to the contact runner 15-2, there may also be arranged further connected trenches (not illustrated) that electrically connect the contact runner 15-2 to the control electrodes 15-a to 15-o. Such further connector trenches may each also comprise a resistance region exhibiting a locally increased Ohmic resistance so as to increase a total Ohmic resistance in a path that couples the contact runner 15-2 to the control electrodes 15a to 15o. Also, said source electrode 10 (not illustrated in FIG. 5) may be electrically connected to said first load contact 11 by means of yet further connector trenches (not illustrated) so as to allow for achieving a specific source resistance, e.g., by means of electrodes includes in said yet further connector trenches.

Figure 6:
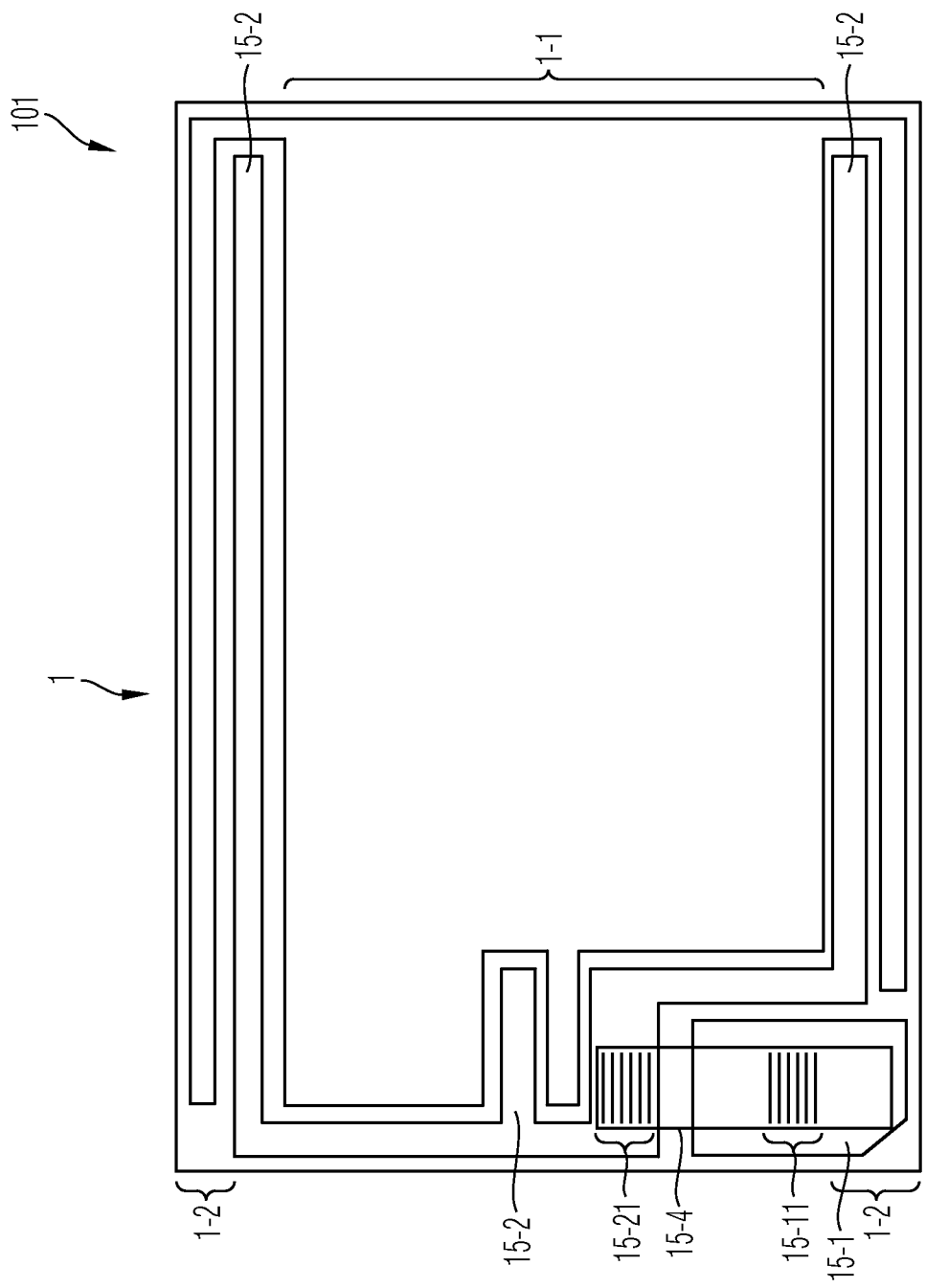
FIG. 6 schematically illustrates a section of a horizontal projection of a semiconductor device according to one or more embodiments.
Figure 7:
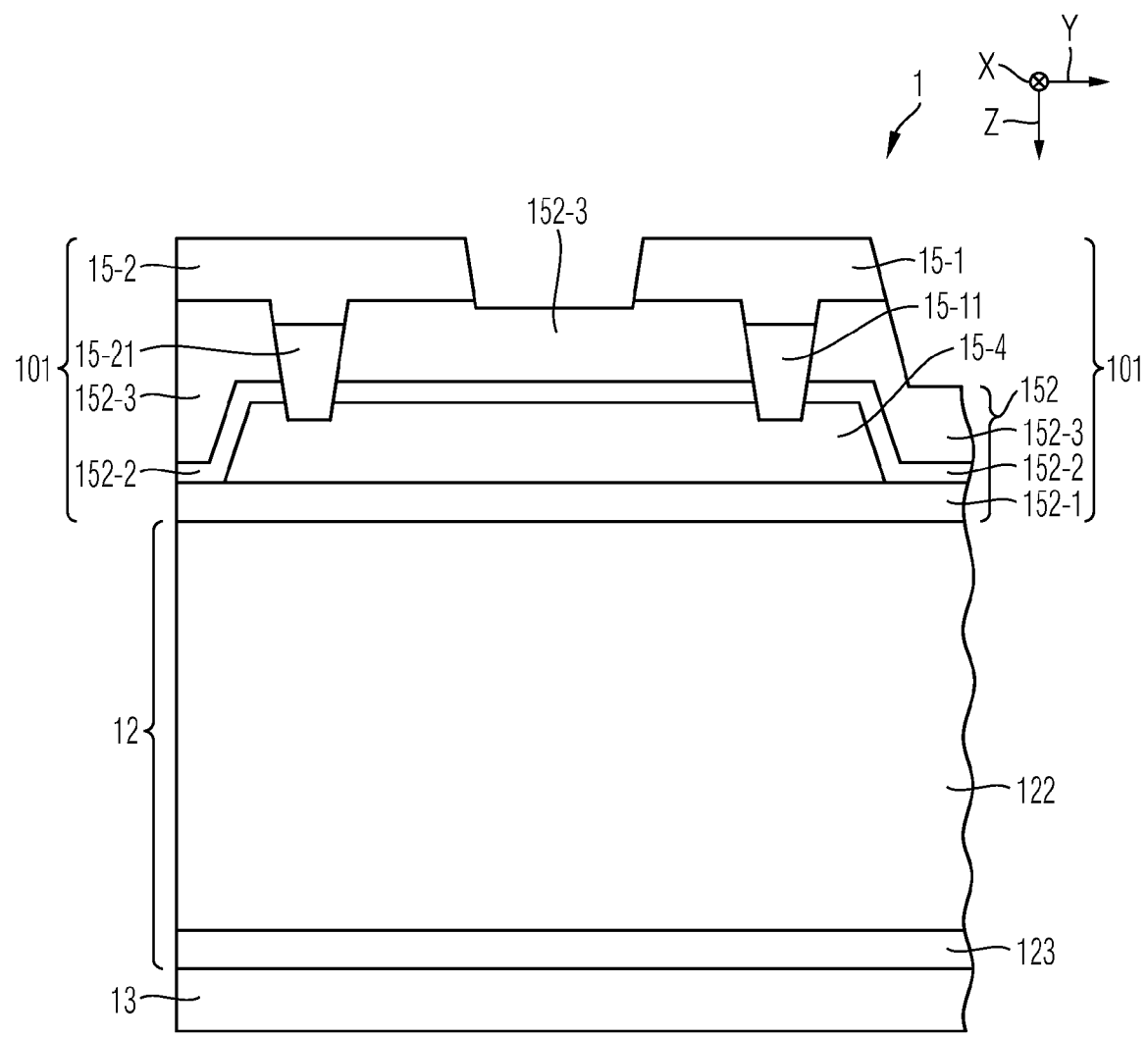
FIG. 7 schematically illustrates a section of a vertical cross-section of a semiconductor device according to one or more embodiments.

FIG. 6 schematically illustrates a section of a horizontal projection of a yet further embodiment of the semiconductor device 1 and FIG. 7 illustrates a section of a vertical cross-section of said embodiment. The structure of the embodiment illustrated in FIG. 6 and FIG. 7 essentially corresponds to the embodiment illustrated in FIG. 5. Thus, what has been stated above with regards to the embodiment illustrated in FIG. 5 also applies to the embodiment illustrated in FIG. 6, if not stated otherwise.

Accordingly, the semiconductor device 1 comprises a semiconductor region 12 extending along an extension direction Z and configured for conducting a load current. For example, the semiconductor region 12 exhibits a setup as schematically illustrated in one or more of FIGS. 1A to 4. Thus, the semiconductor region 12 may comprise, e.g., a plurality of said transistor cells and/or diode cells.

Further, the semiconductor device 1 may comprise a surface region 101 arranged above the semiconductor region 12 and coupled, e.g., mechanically coupled, to said semiconductor region 12. And, at least one electrode (not illustrated in FIGS. 6 and 7) for controlling said load current can be provided, wherein the at least one electrode can be arranged within said surface region 101. For example, the control electrode exhibits a planar structure and is entirely arranged with the surface region 101. In an embodiment, said at least one electrode is a control electrode, e.g., control electrode 15 (control electrodes 15a-o) illustrated in FIGS. 1A-5, or a source electrode, e.g., source electrode 10 illustrated in FIGS. 3-4.

For example, the semiconductor device 1 in accordance with FIGS. 6 and 7 comprises a connector layer 15-4, wherein the connector layer 15-4 can be arranged entirely within said surface region 101, e.g., entirely above the semiconductor region 12. Said connector layer 15-4 can be arranged at the same level as said at least one electrode and can, e.g., be produced within the same manufacturing steps as the at least one electrode. For example, the connector layer 15-4 comprises polysilicon.

Further, the semiconductor device 1 may comprise a contact pad 15-1 arranged within said surface region 101 and above said connector layer 15-4. The contact pad 15-1 may be arranged to be contacted by a bond wire or a clip and may form at least a part of said control terminal 18 (cf. FIGS. 2A-4). Further, the semiconductor device 1 can comprise a contact runner 15-2 arranged within said surface region 101 and above said connector layer 15-4, wherein said contact runner 15-2 can be placed separately from the contact pad 15-1 and be electrically coupled to the at least one control electrode 15a. As already explained with respect to FIG. 5, the contact runner 15-2 may essentially follow the course of the edge region 1-2 of the semiconductor device 12. Both the contact runner 15-1 and the contact pad 15-2 can be spaced apart from said connector layer 15-4, along said extension direction Z, by means of one or more layers of an insulation region 152, as will be explained in more detail below.

The semiconductor device 1 may further comprise at least one first contact plug 15-11, said at least one first contact plug 15-11 extending along said extension direction Z and electrically connecting the contact pad 15-1 to said connector layer 15-4. The semiconductor device 1 may further comprise at least one second contact plug 15-21, said at least one second contact plug 15-21 extending along said extension direction Z and electrically connecting the contact runner 15-2 to said connector layer 15-4. For example each of the at least one first contact plug 15-11 and the at least one second contact plug 15-21 extends into the connector layer 15-4 along said extension direction Z, i.e., by distance of at least 50 nm, or at least 100 nm.

Thus, a path that electrically transmits a control signal received from said bond wire or clip to said at least one electrode may comprise: the contact pad 15-1, the at least one first contact plug 15-11, the connector layer 15-4, the at least one second contact plug 15-21, the contact runner 15-2 and the at least one electrode. All of the aforementioned components may be entirely arranged within said surface region 101, i.e., entirely above said semiconductor region 12. A resistance of said path may be adjusted means of at least one of the following: a distance between said at least one first contact plug 15-11 and said at least one second contact plug 15-21 along said first lateral direction Y; a number of first contact plugs 15-11; a number of second contact plugs 15-21; the material of the at least one first contact plug 15-11 and/or the material of the at least one second contact plug 15-21; the distance by which at least one of the at least one first contact plug 15-11 and the at least one second contact plug 15-21 extends into the connector layer 15-4 along said extension direction Z.

As illustrated in FIG. 6, there may be provided more than only one first contact plug 15-11 and more than only one second contact plug 15-21. The number of first contact plugs 15-11 and the number of second contact plugs 15-21 can be chosen, e.g., such that a requirement with regards to a maximum current density with said plugs 15-11 and 15-21 is met.

For example, said plugs 15-11 and 15-21 can each by realized by means of so-called contact grooves, e.g., little trenches.

Regarding now in more detail the section of the vertical cross-section of the semiconductor device 1 schematically illustrated in FIG. 7, an exemplary configuration of said insulation region 152 shall be explained. For example, the connector layer 15-4 may be electrically insulated from the semiconductor region 12 by means of said insulation region 152. Said insulation region 152 may comprise a number of layers, e.g., a first layer 152-1 that is in contact with both the semiconductor region 12 on the one side and the connector layer 15-4 on the other side. Such first insulation layer 152-1 can be made of a field oxide (FOX), for example. A second insulation layer 152-2 and a third insulation layer 152-3 may be arranged on top of the connector layer 15-4 and may be employed, e.g., for establishing an electrical insulation from the first load contact 11 (not illustrated in FIG. 7) and from the contact pad 15-1 and from the contact runner 15-2. For example, the second insulation layer 152-2 can be made of an undoped silicate glass (USG). Further, the third insulation layer 152-3 can be made, e.g., of borophophosilicate glass (BPSG).

It shall be understood that the embodiments of the semiconductor device 1 schematically illustrated in FIG. 5, in FIG. 6 and in FIG. 7 may exhibit one or more of the features of the embodiments of the semiconductor device 1 schematically illustrated in FIGS. 1A, 1B, 2A, 2B, 2C, 3 and/or 4. In the following, a few examples of optional features of the embodiments in accordance with FIG. 5, FIG. 6 and FIG. 7 are briefly described. The reference signs mentioned below may also refer to FIG. 1A to 4. Further, said optional features briefly described below have already been explained in more detail above with regards to FIG. 1A to 4.

For example, the semiconductor device 1 in accordance with FIG. 5, FIG. 6 and/or FIG. 7 may further comprise at least two trenches 14a, 14b (cf., for example, FIG. 1A) extending into the semiconductor region 12 along the extension direction Z, and the semiconductor region 12 may include a mesa zone 124, the mesa zone 124 being arranged between said two trenches 14a, 14b. For example, the mesa zone 124 is laterally confined by said two trenches 14a, 14b. Said at least one electrode can be a control electrode 15, e.g., a gate (G) electrode, exhibiting a planar structure and arranged above the mesa zone 124.

Further, each trench 14a, 14b may comprises a trench electrode 141a, 141b and an insulator 142a, 142b insulating the respective trench electrode 141a, 141b from the semiconductor region 12. For example, said trench electrodes 141a, 141b form a compensation structure within the semiconductor region 12. To this end, said trench electrodes 141a, 141b can be implemented, e.g., as field plates.

For example, the semiconductor device 1 in accordance with FIG. 5, FIG. 6 and/or FIG. 7 may further comprise a first load contact 11 and a second load contact 13, and the semiconductor region 12 may be arranged in between said first load contact 11 and said second load contact 13 (cf., for example, FIG. 1A). As explained above, the first load contact can be a source (S) contact and the second load contact can be a drain (D) contact.

Each trench electrode 141a, 141b can be electrically connected to the first load contact 11. Thus, the electrical potential of the trench electrodes 141a and 141b may be substantially identical to the electrical potential of the first load contact.

The mesa zone 124 may include a first semiconductor contact zone 121 that comprises a semiconductor body region 121-1 and a semiconductor source region 121-3, the semiconductor source region 121-3 being electrically connected to the first load contact 11 and being in contact with the semiconductor body region 121-1 (cf., for example, FIG. 1A).

As schematically illustrated in, e.g., FIG. 1A, the control electrode 15 may exhibit a planar structure and may be arranged above said first semiconductor contact zone 121. Further, the control electrode 15 can be electrically insulated from the semiconductor region 12, the first load contact 11 and from the second load contact 13. As explained with respect to FIGS. 5 to 7, said control electrode 15 can be electrically connected to said contact runner 15-2, wherein said contact runner 15-2 can be electrically coupled to said contact pad 15-1 by means of said connector electrode(s) of the at least one connector trench 16a or by means of said connector layer 15-4.

For example, the semiconductor device 1 in accordance with FIG. 5, FIG. 6 and/or FIG. 7 may be configured for establishing a load current path for conduction of said load current in dependence of a difference between an electrical potential of the control electrode 15 and an electrical potential of said first load contact 11. For example, said load current path comprises, in a vertical cross-section of said mesa zone 124, only a single inversion channel, the single inversion channel being included in said semiconductor body region 121-1. This optional feature has already been explained in detail above.

The embodiments schematically illustrated in FIG. 1A to FIG. 7 and described above include the recognition that a vertical power MOSFET can be optimized with regards to a small on-state resistance ($R_{DSon}$). To this end, so-called compensation structures can be employed. Such devices are also referred to as "superjunction devices", or to "CoolMOS devices". For example, compensation can be achieved by means of vertical field plates, as they are exemplary employed in accordance with the embodiments illustrated and described above. Whereas the on-state resistance may be significantly reduced by means of said vertical field plates, e.g., by means of said trench electrodes 141a and 141b, the output charge of the semiconductor device may under circumstances increase, thereby increasing dynamic losses, e.g., switching losses of the semiconductor device. Further, such output charge may induce over voltages during switching processes, which may cause damages to the semiconductor device and increase losses. It can be desirable to decrease switching losses.

In accordance with one or more embodiments, the gate-drain charge ($Q_{GD}$) can be reduced by means of employing planar gate electrodes, such as, e.g., said control electrode. For example, said control electrode having a planar structure may allow for a precise control of the gate-drain charge, e.g., by means of a well-defined overlap along said first lateral direction between the current-spread region and the control electrode. To this end, said current-spread region can be created, e.g., by means of an implantation process that is self-aligned with respect to said control electrode. Further, in accordance with one or more embodiments, by means of a reduced pitch P, which may result in an asymmetrical structure of the cell, as exemplary and schematically illustrated, e.g., in FIG. 1A, a further reduction of the on-state resistance can be achieved, since, e.g., the doping concentration of the drift zone can be increased.

For example, said current-spread regions having a higher doping concentration as the drift zone can be provided, e.g., in order to allow for a spread-out of the load current, e.g., a spread-out of the inversion channel, within the mesa zone. Thereby, a substantially homogenous current density can be achieved even within said asymmetrical structured mesa zone, which may result in a yet further reduced on-state resistance.

Further, in accordance with one or more embodiments, a specific gate series resistance may be produced by means of said contact plugs and said connector layer and/or by said connector electrodes being present within said connector trenches that may connect, e.g., said contact runner to said contact pad, wherein the contact runner may be electrically connected to said control electrodes. As explained above, by means of such connector electrodes, a resistance region that exhibits a locally increased resistance can be achieved, e.g., by use of corresponding materials and/or by varying a cross-section area of the connector electrodes.

Features of further embodiments are defined in the dependent claims. The features of further embodiments and the features of the embodiments described above may be combined with each other for forming additional embodiments, as long as said features are not explicitly described as being alternative to each other.

For facilitating understanding of exemplary embodiments schematically illustrated in the drawings, the control electrode 15 has occasionally been labelled with a "G", which may be an abbreviation for "Gate". The first load contact 11 has occasionally been labelled with an "S", which may be an abbreviation for "Source". The second load contact 13 has occasionally been labelled with a "D", which may be an abbreviation for "Drain". However, such labels are not intended to be limiting. For example, even though the drain regions including, e.g., a section of said second load contact zone 13, and the source regions including, e.g., a section of said first load contact 11, have been illustrated at opposite sides of the semiconductor device 1, it shall be understood that the semiconductor device 1 may also exhibit a so-called "drain-up" configuration, e.g., a configuration where both the source and the drain metallizations are arranged at a common side of the semiconductor device 1, e.g., at a front side of the semiconductor device 1.

In the above, embodiments pertaining to semiconductor devices were explained. For example, these semiconductor devices are based on silicon (Si). Accordingly, a monocrystalline semiconductor region or layer, e.g., the semiconductor regions 12, 121, 122, 123, 124, 125 of exemplary embodiments, is typically a monocrystalline Si-region or Si-layer. In other embodiments, polycrystalline or amorphous silicon may be employed.

It should, however, be understood that the semiconductor regions 12, 121, 122, 123, 124, 125 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device comprising a first load contact, a second load contact and a semiconductor region configured to conduct a load current between the first load contact and the second load contact in at least a forward direction, wherein the semiconductor region includes:
    a first semiconductor contact zone comprising a semiconductor body region and a semiconductor source region, the semiconductor source region being electrically connected to the first load contact and being in contact with the semiconductor body region;
    a second semiconductor contact zone electrically connected to the second load contact;
    a semiconductor drift zone coupling the first semiconductor contact zone to the second semiconductor contact zone, wherein the semiconductor body region isolates the semiconductor source region from the semiconductor drift zone;
    wherein the semiconductor device further comprises, in a vertical cross-section:
    at least two trenches extending into the semiconductor region along an extension direction that points from the first semiconductor contact zone to the second semiconductor contact zone, each trench comprising a trench electrode and an insulator insulating the respective trench electrode from the semiconductor region, wherein the semiconductor region comprises a mesa zone arranged between the at least two trenches, the mesa zone including the first semiconductor contact zone;
    and wherein the semiconductor device is configured to establish a load current path for conduction of the load current in the forward direction, the load current path comprising, in a vertical cross-section of the mesa zone parallel to said vertical cross-section that includes said at least two trenches, only a single inversion channel, the single inversion channel being included in the semiconductor body region; and
    wherein the semiconductor device further comprises a control electrode arranged above the first semiconductor contact zone, wherein the semiconductor device is configured to establish the load current path for conduction of the load current in the forward direction in dependence of a difference between an electrical potential of the control electrode and an electrical potential of the first load contact.

2. The semiconductor device of claim 1, wherein the load current path for conduction of the load current in the forward direction comprises, within the vertical cross-section of the mesa zone, only one first-load-contact-to-semiconductor transition within the mesa zone, wherein the first-load-contact-to-semiconductor transition is formed by a transition between the semiconductor source region and the first load contact.

3. The semiconductor device of claim 2, wherein the first-load-contact-to-semiconductor transition exhibits an area in parallel to the extension direction so that the load current, when crossing the first-load-contact-to-semiconductor transition, flows in a direction perpendicular to the extension direction.

4. The semiconductor device of claim 1, wherein the semiconductor device further comprises a source electrode arranged above the mesa zone and separately from the control electrode, wherein the source electrode is electrically connected with the first load contact and insulated from the control electrode.

5. The semiconductor device of claim 4, wherein the semiconductor region comprises a third semiconductor contact zone included in the mesa zone, the third semiconductor contact zone being arranged below the source electrode and in contact with the first load contact.

6. The semiconductor device of claim 5, wherein:
the semiconductor region is also configured to conduct a load current between the first load contact and the second load contact in a reverse direction opposite to the forward direction;
the semiconductor device is configured to establish a further load current path for conduction of the load current in the reverse direction in dependence of a difference between an electrical potential of the second load contact and an electrical potential of the first load contact, wherein the further load current path includes, in a vertical cross-section of the mesa zone, at least one of an inversion channel and an accumulation channel included in the third semiconductor contact zone.

7. The semiconductor device of claim 1, wherein each of the trench electrodes comprises a field plate electrode.

8. The semiconductor device of claim 1, wherein each of the trench electrodes is electrically connected to the first load contact.

9. The semiconductor device of claim 1, wherein each of the trench electrodes comprises a first electrode part and a second electrode part electrically insulated from the first electrode part by the insulator, wherein the first electrode part is electrically connected to the first load contact.

10. The semiconductor device of claim 1, wherein a distance between the at least two trenches in a first lateral direction perpendicular to the extension direction amounts to less than 1.5 µm.

11. The semiconductor device of claim 1, wherein the semiconductor drift zone further comprises, within the mesa zone, a semiconductor current-spread region configured to spread the load current path, wherein the semiconductor current-spread region is positioned in contact with the semiconductor body region.

12. The semiconductor device of claim 11, wherein the semiconductor current-spread region extends, in a first lateral direction perpendicular to the extension direction, from the insulator of a first one of the at least two trenches to the insulator of a second one of the at least two trenches.

13. The semiconductor device of claim 1, wherein at least one of the at least two trenches exhibits an interior region of a non-conducting material, the interior region being surrounded by the trench electrode of the at least one trench.

14. A semiconductor device, comprising:
a first load contact, a second load contact and a semiconductor region extending along an extension direction;
a surface region arranged above the semiconductor region and coupled to the semiconductor region;
at least one control electrode arranged within the surface region;
at least one connector trench extending into the semiconductor region along the extension direction, the at least one connector trench including a connector electrode;
a contact pad arranged within the surface region; and
a contact runner arranged within the surface region and placed separately from both the contact pad and the at least one control electrode, the contact pad, the contact runner and the at least one control electrode being electrically coupled to each other, wherein either both the contact pad and the contact runner or both the contact runner and the at least one control electrode are electrically connected to the connector electrode of the at least one connector trench.

15. The semiconductor device of claim 14, wherein the at least one control electrode exhibits a planar stripe structure arranged perpendicular to the extension direction.

16. The semiconductor device of claim 14, further comprising a plurality of trenches extending into the semiconductor region along the extension direction, wherein the semiconductor region includes a plurality of mesa zones, each of the mesa zones being arranged between respective two adjacent trenches of the plurality of trenches, and wherein the at least one control electrode is arranged above one of the mesa zones.

17. The semiconductor device of claim 16, wherein the mesa zone includes a first semiconductor contact zone electrically connected to the first load contact, wherein the at least one control electrode exhibits a planar structure that is aligned to the first semiconductor contact zone with respect to the extension direction so as to cover at least a part of the first semiconductor contact zone.

18. The semiconductor device of claim 14, wherein the connector electrode comprises a resistance region exhibiting a locally increased Ohmic resistance so as to increase a total Ohmic resistance in a path that couples the contact pad to the control electrode or, respectively, in a path that couples the contact runner to the at least one control electrode.

19. A semiconductor device, comprising:
a semiconductor region extending along an extension direction and configured to conduct a load current;
a surface region arranged above the semiconductor region and coupled to the semiconductor region;
at least one control electrode configured to control the load current, the at least one control electrode being arranged within the surface region;
a connector layer arranged within the surface region;
a contact pad arranged within the surface region and above the connector layer;
a contact runner arranged within the surface region and above the connector layer, the contact runner being placed separately from the contact pad and being electrically coupled to the at least one control electrode;
at least one first contact plug extending along the extension direction and electrically connecting the contact pad to the connector layer;

at least one second contact plug extending along the extension direction and electrically connecting the contact runner to the connector layer;

at least two trenches extending into the semiconductor region along the extension direction, each trench comprising a trench electrode and an insulator insulating the respective trench electrode from the semiconductor region, the semiconductor region including a mesa zone arranged between the at least two trenches, the at least one control electrode being arranged above the mesa zone;

a first load contact and a second load contact, the semiconductor region being arranged between the first load contact and the second load contact, wherein:

each trench electrode is electrically connected to the first load contact;

the mesa zone includes a first semiconductor contact zone comprising a semiconductor body region and a semiconductor source region, the semiconductor source region being electrically connected to the first load contact and being in contact with the semiconductor body region; and the at least one control electrode is arranged above the first semiconductor contact zone and electrically insulated from the semiconductor region, the first load contact and from the second load contact.

20. The semiconductor device of claim 19, wherein the semiconductor device is configured to establish a load current path for conduction of the load current in dependence of a difference between an electrical potential of the control electrode and an electrical potential of the first load contact.

* * * * *